(12) United States Patent
Carta et al.

(10) Patent No.: US 7,394,158 B2
(45) Date of Patent: Jul. 1, 2008

(54) SOLDERABLE TOP METAL FOR SIC DEVICE

(75) Inventors: Rossano Carta, Turin (IT); Laura Bellemo, Canavese (IT); Luigi Merlin, Turin (IT)

(73) Assignee: Siliconix Technology C.V., Singapore (SG)

( * ) Notice: Subject to any disclaimer, the term of this patent is extended or adjusted under 35 U.S.C. 154(b) by 131 days.

(21) Appl. No.: 11/255,021

(22) Filed: Oct. 20, 2005

(65) Prior Publication Data

US 2006/0086939 A1    Apr. 27, 2006

Related U.S. Application Data

(60) Provisional application No. 60/620,756, filed on Oct. 21, 2004.

(51) Int. Cl.
*H01L 23/48* (2006.01)

(52) U.S. Cl. ...................................... 257/762

(58) Field of Classification Search ......... 257/734–738, 257/762, 77, E23.02
See application file for complete search history.

(56) References Cited

U.S. PATENT DOCUMENTS

| 5,047,833 A * | 9/1991 | Gould .......................... 257/772 |
| 2005/0200011 A1 | 9/2005 | Standing et al. .............. 257/736 |
| 2006/0220027 A1 | 10/2006 | Takahashi et al. |

OTHER PUBLICATIONS

International Search Report for PCT/US05/38118 dated Feb. 6, 2007.

* cited by examiner

*Primary Examiner*—Nathan W Ha

(57) ABSTRACT

A silicon carbide device includes at least one power electrode on a surface thereof, a solderable contract formed on the power electrode, and at least one passivation layer that surrounds the solderable contact but is spaced from the solderable contract, thereby forming a gap.

20 Claims, 13 Drawing Sheets

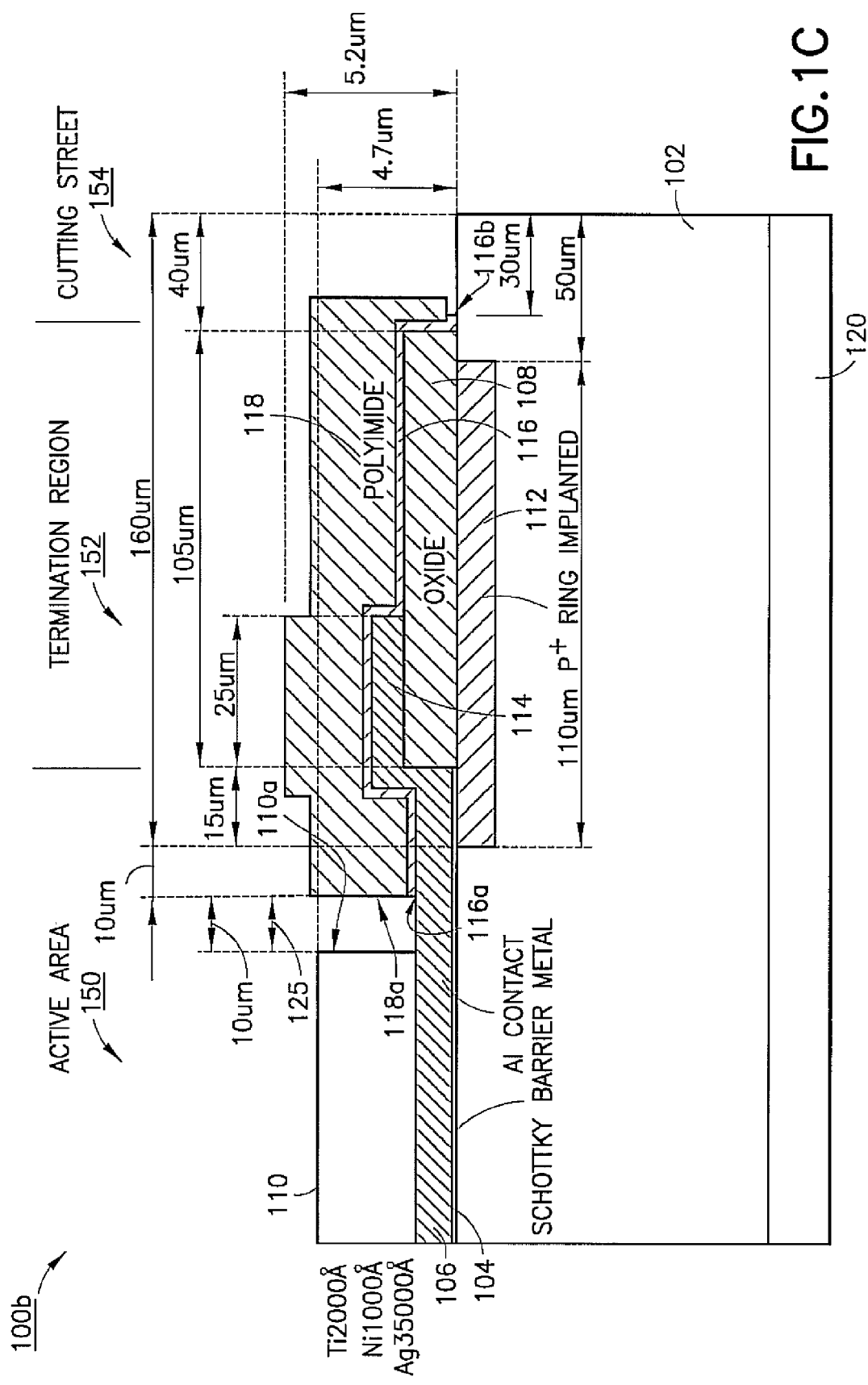

SOLDERABLE TOP METAL FOR SIC DEVICE

RELATED APPLICATION

This application is based on and claims benefit of U.S. Provisional Application No. 60/620,756, filed on Oct. 21, 2004, entitled "Solderable Top Metal For SiC Die," to which a claim of priority is hereby made and the disclosure of which is incorporated by reference.

BACKGROUND OF THE INVENTION

1. Field of the Invention

This invention relates generally to semiconductor devices, and more specifically, to a solderable contact for silicon carbide semiconductor devices.

2. Description of the Prior Art

Silicon carbide (SiC) is becoming a mature technology for high power devices and is used to fabricate advanced devices such as Schottky diodes, transistor JFETs, and MOSFETs, for example. Notably, SiC devices can be packaged such that wire bonds, for example, connect the electrodes of the device to a device package leadframe. However, to fully exploit the high performance characteristics of a SiC device, device package types are required such that one or more electrodes of the device are electrically and mechanically connected directly to the device package leadframe, for example, or are connected through clips/straps to the device package leadframe, for example. Device packages of these types may include standard solderable packages, flipped SiC packages, clip attach packages, and the DirectFET® package.

Notably, in order to form these types of direct connections to the electrodes of a SiC device, a conductive adhesive, such as solder or the like, is required. However, one or more electrodes of a SiC device are often formed of a metal, such as aluminum, that does not readily adhere to solder. As such, in order to form a solder-based connection to these electrodes, a solderable contact is often formed directly on the surface of the electrode and the package connection, for example, then made to this solderable contact. As an example, the solderable contact may be an alloy that contains silver.

As is known, the electrodes of a device may be insulated from other surfaces of the device, such as device terminations, by an insulation passivation layer. Notably, forming a reliable passivation layer in conjunction with a solderable contact as just described may be difficult. For example, the metal deposition, cleaning, and etching steps required to form the solderable contact may damage or alter the passivation/termination layer.

In addition, it has been found that under prolonged exposure to electric fields and moisture, silver ions, for example, from a solderable contact can migrate and form dendrites. This migration is referred to as metal electromigration. Notably, when solder is applied to the surfaces of a solderable contact in order to attach an electrode to a device package, for example, the solder will typically dissolve the exposed silver along the surfaces of the contact, forming a solder alloy. As a result, the silver becomes captured within the alloy and cannot migrate from the solderable contact to create dendrites.

However, the passivation layer of a device often overlaps, for example, the edges of the electrodes. As a result, the passivation layer may abut/contact the solderable contact on a given electrode and conceal portions of the outer surfaces of the contact, preventing the silver along these surfaces from being reached during soldering. This silver may be a source of migrating ions, which may migrate over the passivation layer and form dendrites. Over time, these dendrites may damage the passivation layer, reducing device reliability. As an example, the dendrites may form conductive bridges between the device electrodes and the device terminations.

Accordingly, it would be desirable to provide a solderable contact that does not affect the reliability of a SiC device.

SUMMARY OF THE INVENTION

According to an embodiment of the present invention, a SiC device includes at least one power electrode on a top surface of a SiC substrate. The device may be, for example, a Schottky diode. The device also includes a semi insulating passivation layer that overlies the outer peripheral edge, for example, of the power electrode and in particular, may surround the outer peripheral edge of the electrode. In the case of a Schottky diode, this passivation layer may also extend over a termination region that surrounds the power electrode. The passivation layer may be an amorphous silicon layer.

The device further includes a solderable contact deposited on a top surface of the power electrode. The solderable contact may be, for example, a silver-containing contact, such as a trimetal stack containing silver. As an example, the trimetal stack may be a titanium/nickel/silver stack, a chromium/nickel/silver stack, or some other conventional trimetal stack known in the art.

According to an embodiment of the present invention, the solderable contact may be formed such that the edge/side of the solderable contact is a spaced distance from the confronting/adjacent edge/side of the amorphous silicon passivation layer, thereby forming a gap/opening between the solderable contact and the passivation layer. This gap preferably extends vertically to the top surface of the electrode and in addition, preferably surrounds the outer periphery of the solderable contact. Hence, if the electrode is made of aluminum for example, the gap forms an aluminum frame around the solderable contact. The gap may be from about 5 um to about 80 um wide and preferably, may be about 10 um wide.

According to an embodiment of the present invention, when solder is applied to the solderable contact to connect the contact to a device package leadframe or clip/strap for example, the gap assists in containing the solder inside the area of the solderable contact as the solder is reflowed. Hence, if the device includes a surrounding termination region, for example, the gap helps to prevent the solder from extending into the termination region. In addition, the gap also exposes the entire top and side surfaces of the solderable contact, thereby preventing the amorphous silicon passivation layer from concealing any of the surfaces of the contact. As a result, as solder is applied to the solderable contact and reflowed, the solder is able to cover the entire outer exposed surface of the solderable contact and thereby dissolve the exposed silver along these surfaces and form a solder alloy. In this way, the silver is fully captured within the alloy, limiting the effect of silver ion electromigration and the formation of dendrites over the passivation layer.

According to another embodiment of the present invention, a second insulating passivation layer is formed over the top surface of the amorphous silicon passivation layer and in particular, preferably extends from the above mentioned gap to the outer end/edge of the amorphous silicon passivation layer. According to a further aspect of the invention, the second passivation layer may extend beyond the outer end/edge of the amorphous silicon passivation layer. This second passivation layer may be added in cases of high roughness and for reliability needs and may be a photo imagable polyimide layer, a PSG (phosphor silicate glass) oxide layer, or a silicon nitride layer, for example. According to the present invention, the edge/side of the solderable contact and the confronting/adjacent edge/side of the second passivation layer act to further define the gap.

According to an embodiment of the present invention, the second passivation layer preferably has a thickness such that the top surface of the passivation layer at least has the same height as the top surface of the solderable contact in the area of the gap. In this way, the gap and the side/edge of the second passivation layer further assist in containing the solder inside the area of the solderable contact as the solder is reflowed, as described above.

A semiconductor device according to the present invention may be fabricated using substantially the same process steps used to form a comparable device that is packaged using wire bonds (i.e., a bondable device) for example, thereby making the fabrication of a device of the present invention compatible with current SiC processing steps. For example, if fabricating a SiC Schottky diode, the Schottky contact, anode electrode, device termination, and amorphous silicon passivation layer over the device termination may be formed using process steps used to fabricate a bondable device. Thereafter, a solderable top metal may be applied over the top surface of the device and etched to form the solderable contact and surrounding gap of the present invention. If device reliability/roughness is an issue, the second passivation layer may then be formed over the amorphous silicon passivation layer.

Notably, a device, such as a Schottky diode, according to the present invention may have different forms of terminations including different forms of field plates, guard rings (e.g., single, multiple, and floating), and JTE terminations, for example. In addition, the present invention is capable of reliably providing a robust termination and passivation for SiC devices from about 300V up to about 1600V.

Other features and advantages of the present invention will become apparent from the following description of the invention which refers to the accompanying drawings.

BRIEF DESCRIPTION OF THE DRAWINGS

FIG. 1C shows a cross-sectional view of a portion of a semiconductor device according to another embodiment of the invention.

DETAILED DESCRIPTION OF THE PREFERRED EMBODIMENTS

Figure 1A:
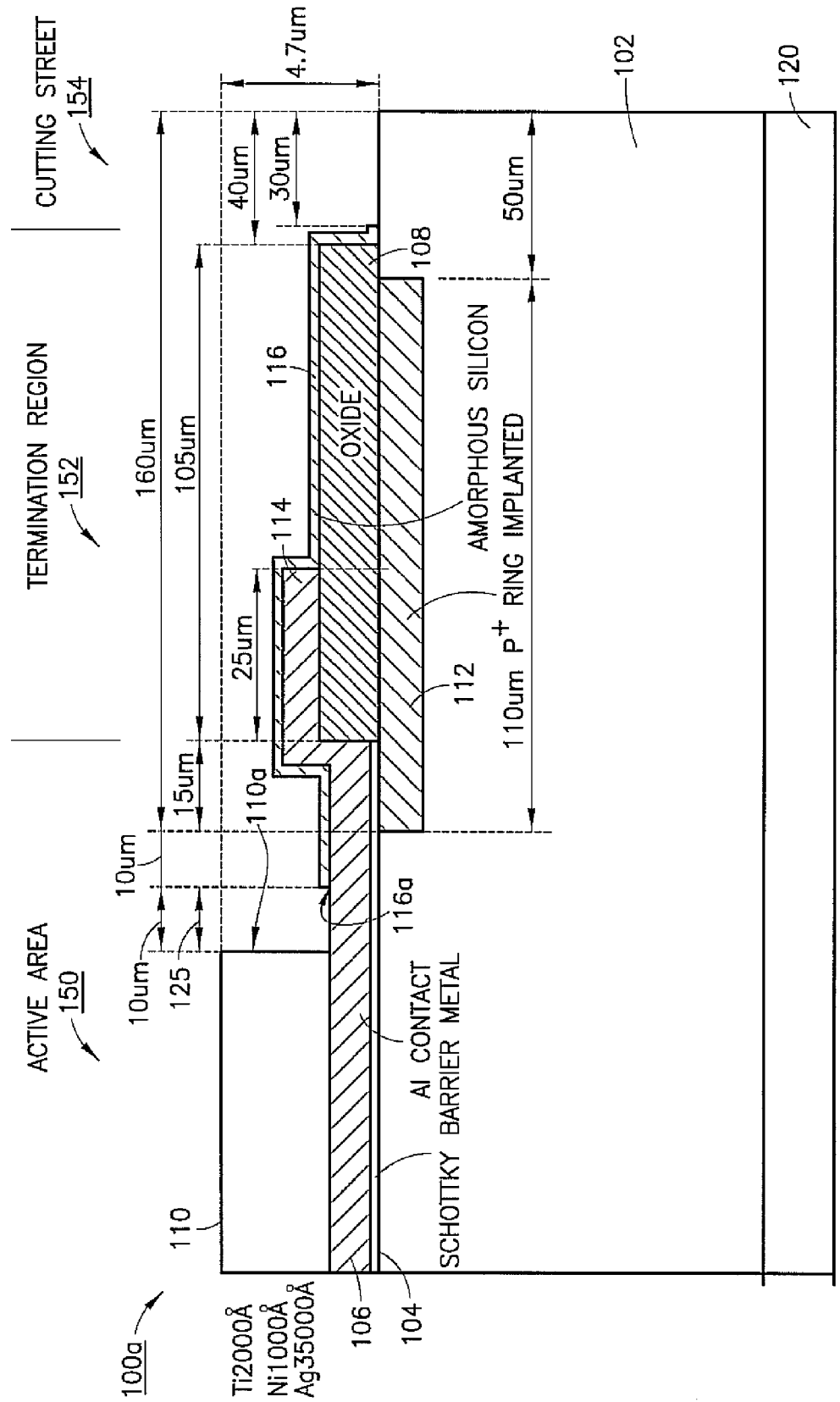
FIG. 1A shows a cross-sectional view of a portion of a semiconductor device according to an embodiment of the invention.

Referring to FIG. 1A, there is shown in cross section a small portion of a semiconductor device 100a according to a preferred embodiment of the present invention (note that the dimensions shown in FIG. 1A are for example purposes and that device 100a is not drawn to scale). As an example, device 100a is a SiC Schottky diode with a single ring field plate termination and a blocking voltage of about 600V, and may be a 6 Å device with a die size of about 1450×1450 um. Nonetheless, one skilled in the art will recognize that the present invention is not limited to SiC Schottky diodes and is not limited to these dimensions.

As shown in FIG. 1A, device 100a includes a SiC substrate 102. As an example, substrate 102 may have the following parameters, although one skilled in the art will recognize that the invention is not limited to these parameters: Cs bulk 0.019 ohm/cm=3E18 Tx 350µ; Epi 7µ concentration doping 9E15 dopant type nitrogen; and Epi 7 um. On the top surface of substrate 102 along active area 150 is a Schottky barrier metal 104, made of titanium for example, which forms a Schottky contact with substrate 102. As an example, device 100a may have a Ti barrier length of 1.01 eV. Formed over Schottky barrier metal 104 is contact metal 106. This contact metal may be made of aluminum, for example, and may have a thickness of 1 um, for example. Contact metal 106 forms the anode power electrode of device 100a and acts as a diffusion barrier that protects Schottky barrier metal 104 from interactions from other metals, such as solderable contact 110.

A termination region 152 surrounds the periphery of active area 150 and includes a field oxide ring 108 formed along the top surface of substrate 102, which oxide ring may have a thickness of about 7000 Å, for example. Termination region 152 further includes a guard ring 112 of P$^+$ conductivity formed within the top surface of substrate 102. The guard ring extends along field oxide ring 108 and under a portion of Schottky barrier metal 104. As shown in FIG. 1A, a portion of contact metal/anode electrode 106 extends within termination region 152 and over a portion of the top surface of field oxide ring 108, thereby forming field plate 114. A semi insulating passivation layer 116 overlies the exposed top and side surfaces of field oxide ring 108 and field plate 114. Passivation layer 116 also extends over the outer peripheral edge of anode power electrode 106 and in this way, surrounds the outer peripheral edge of the electrode. Passivation layer 116 may have a thickness of about 1900 Å, for example, and may be an amorphous silicon layer, for example.

Along the bottom surface of substrate 102 is a conventional contact metal 120 that forms a cathode electrode.

Device 100a further includes a solderable contact 110 that is deposited on a top surface of the anode electrode 106 and that may extend, for example, about 4.7 um above the top surface of substrate 102. This solderable contact may be, for example, a silver-containing contact, such as a trimetal stack containing silver. As an example, the trimetal stack may be a titanium/nickel/silver stack each with a respective thickness of about 2000 Å, 1000 Å, and 35000 Å, for example. Alternatively, the trimetal stack may be a chromium/nickel/silver stack, or some other conventional trimetal stack known in the art.

Figure 1B:
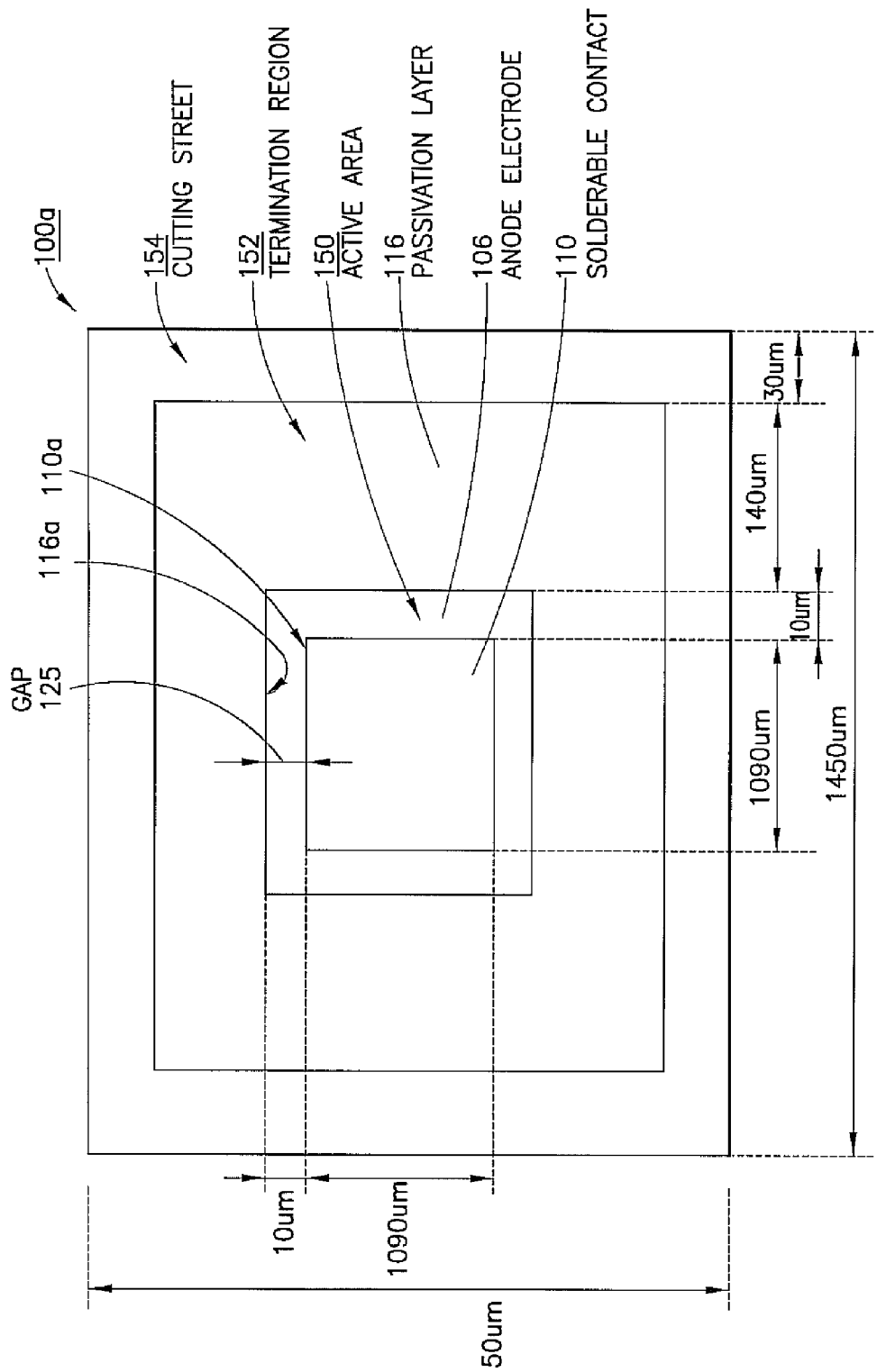
FIG. 1B shows a top plan view of the semiconductor device of FIG. 1A, with FIG. 1B showing the complete top surface of the device.

According to an embodiment of the present invention and as shown in FIG. 1A, solderable contact 110 may be formed such that the edge/side 110a of the solderable contact is a spaced distance from the confronting/adjacent edge/side 116a of passivation layer 116, thereby forming a gap/opening 125 therebetween. Gap 125 preferably extends vertically to the top surface of anode electrode 106, thereby exposing the top surface and the aluminum thereof, assuming the electrode is made of aluminum. As shown in FIG. 1B, which shows a top view of the entire top surface of device 100a, gap 125 preferably surrounds the outer periphery of solderable contact 110, thereby forming, for example, an aluminum frame around the solderable contact (note that the dimensions shown in FIG. 1B are for example purposes). Gap 125 may be from about 5 um to about 80 um wide and preferably, may be about 10 um wide.

Significantly, when solderable contact 110 of device 100a is attached by solder to a clip/strap or a leadframe of a device package, for example, gap 125 assists in containing the solder inside the area of the solderable contact as the solder is reflowed, thereby preventing the solder from extending into termination region 152. In addition, gap 125 exposes the entire top and side surfaces of solderable contact 110, thereby preventing passivation layer 116 from concealing any of the surfaces of the solderable contact. As a result, as solder is applied to the solderable contact and reflowed, the solder is able to cover the entire outer exposed surface of the solderable contact and thereby dissolve the exposed silver along these surfaces and form a solder alloy. In this way, the silver is fully captured within the alloy, limiting the effect of silver ion electromigration and the formation of dendrites over passivation layer 116.

Referring now to FIG. 1C in which like numerals identify like features, there is shown in cross section a portion of a semiconductor device 100b according to an embodiment of the present invention. Device 100b is similar to device 100a and now further includes a second insulating passivation layer 118 formed over passivation layer 116. In particular, passivation layer 118 extends from side/edge 116a of passivation layer 116 along the full length thereof. Alternatively and as shown in FIG. 1C, passivation layer 118 may extend beyond the end 116b of passivation layer 116 and into cutting street 154, for example, in order to seal the entire termination layer, for example. Passivation layer 118 may be added in cases of high roughness and for reliability needs. Passivation layer 118 may have a thickness of about 3 um substantially over the length thereof, for example, and may be a photo imagable polyimide layer, a PSG (phosphor silicate glass) oxide layer, or a silicon nitride layer, for example, depending on the device application and/or device reliability requirements. According to an embodiment of the invention and as shown in FIG. 1C, the edge/side 118a of passivation layer 118 that is adjacent to side/edge 110a of solderable contact 110 acts to further define gap 125.

The thickness or height of passivation layer 118 is based on the passivation quality of the material from which the layer is formed and on the blocking voltage of the device. Preferably, however, passivation layer 118 has a thickness such that the top surface of the passivation layer at least has the same height as the top surface of solderable contact 110 in the area of gap 125, as shown in FIG. 1C. In this way, gap 125 and side/edge 118a of passivation layer 118 further assist in containing the solder inside the area of the solderable contact 110 as the solder is reflowed, thereby preventing the solder from extending into the termination region.

Figure 2A:
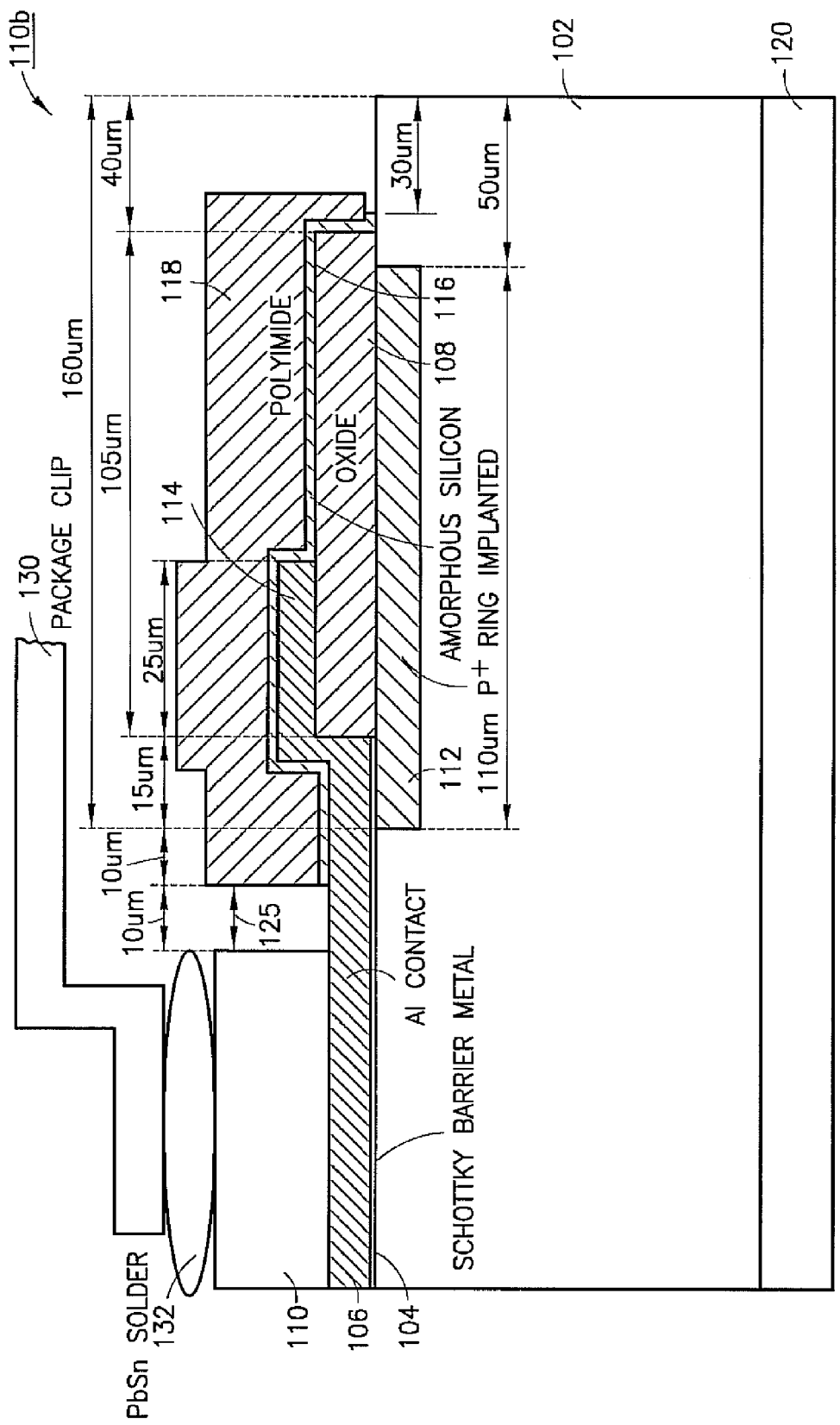
FIGS. 2A and 2B show process steps according to an embodiment of the invention for attaching a package clip to a power electrode of the semiconductor device of FIG. 1C.
Figure 2B:
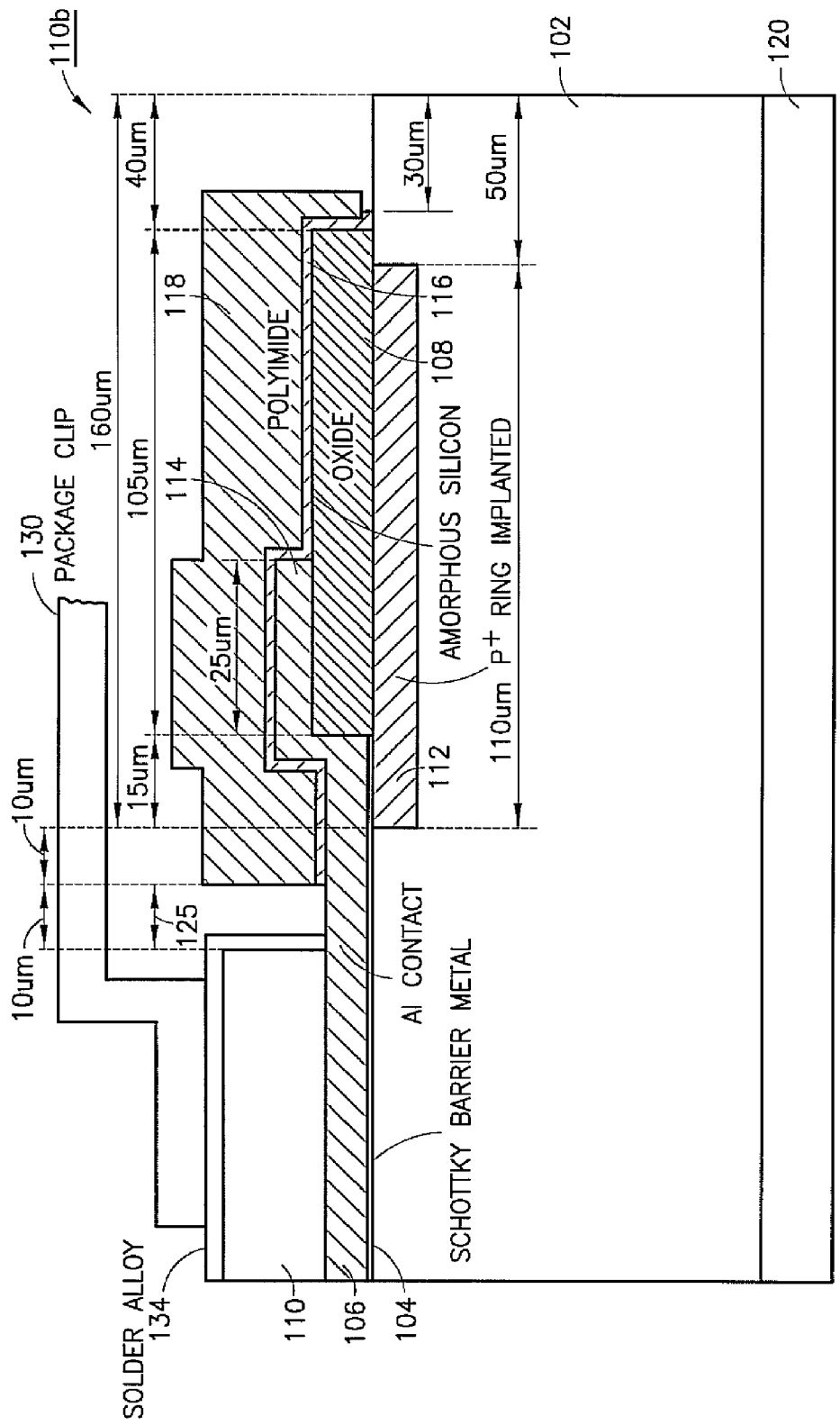

In general, the present invention is applicable to all cases where a solderable contact is needed. For example, referring to FIGS. 2A and 2B, there is shown a clip/strap 130 secured to solderable contact 110 of device 100b according to an embodiment of the invention (note that a clip/strap would be similarly secured to device 100a). Clip/strap 130 may connect anode electrode 106 to the leadframe of a device package, such as a TO220 clip attach package, for example (note that FIG. 1C does not show the interconnection between the clip and leadframe). As shown in FIG. 2A, solder paste 132, for example, is first placed on solderable contact 110 and clip 130 is then placed directly on the surface of the solderable contact. Thereafter, the solder is reflowed to attach the clip to the solderable contact, as shown in FIG. 2B. As illustrated in this Figure and as described above, as the solder is reflowed, the solder covers the entire outer exposed surface of solderable contact 110, thereby dissolving the exposed silver along these surfaces and forming a solder alloy 134 that helps to prevent the formation of dendrites.

As another example, for a package with a top side leadframe, the leadframe may be placed directly on solderable contact 110 in a similar fashion as shown in FIG. 2A and secured in a similar fashion as shown in FIG. 2B. As a further example, for device packages whereby the SiC die is flipped-chip mounted to a substrate, for example, solderable contact 110 may be placed directly on the pads of the substrate and soldered thereto.

A semiconductor device according to the present invention may be fabricated using substantially the same process steps used to form a comparable device that is packaged using wire bonds (i.e., a bondable device) for example, thereby making the fabrication of a device of the present invention compatible with current SiC processing steps. For example, referring to FIG. 3A, there is shown a partially fabricated SiC Schottky diode that resembles devices 100a and 100b. If a bondable form of the diode is required, the device is completed by applying a contact metal 120 on the bottom surface of the device to form a cathode electrode. Alternatively, several additional fabrication steps may be performed in order to form solderable contact 110 and optionally, passivation layer 118 of the present invention.

Figure 3A:
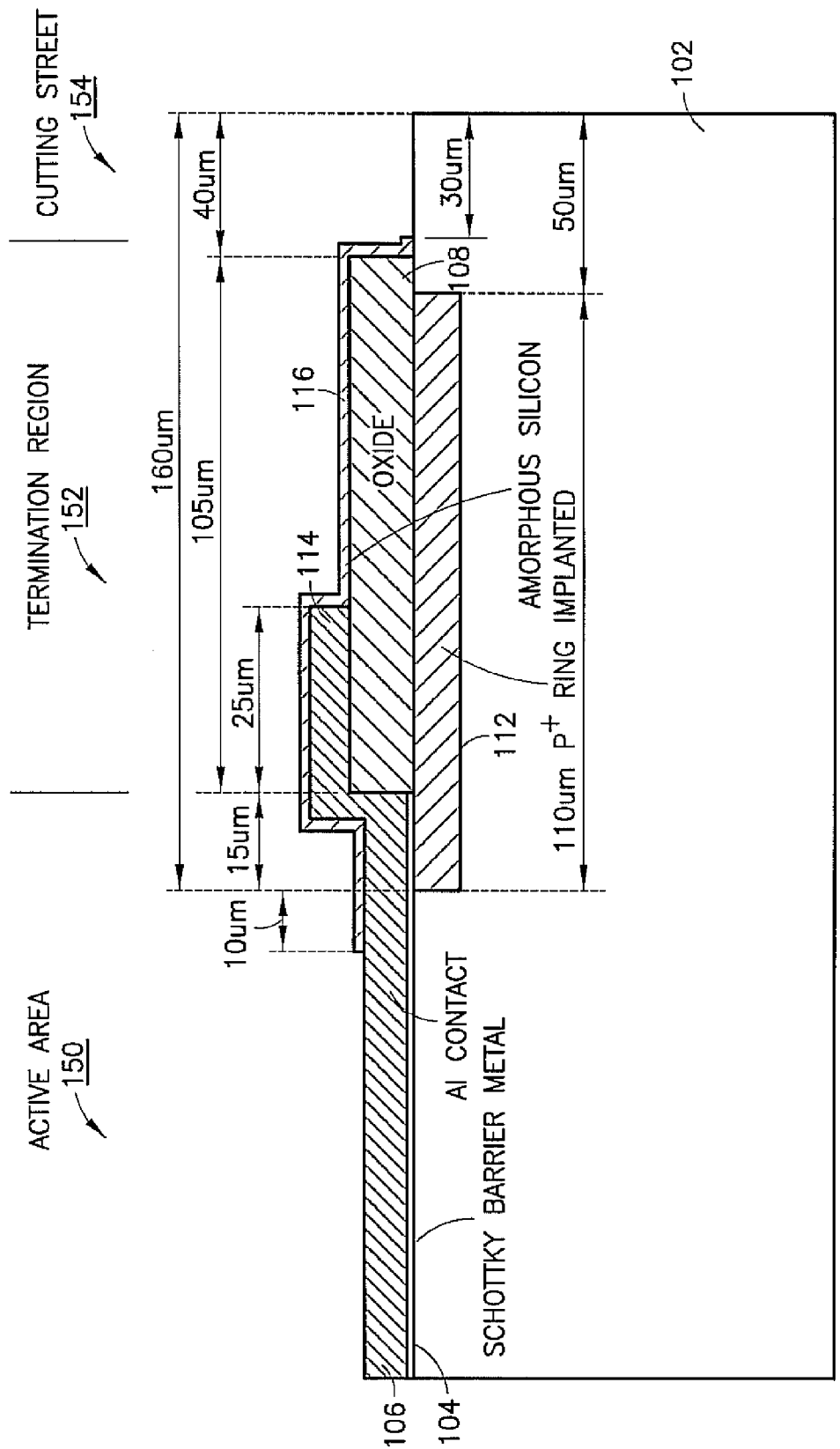
FIGS. 3A, 3B, and 3C illustrate a process according to an embodiment of the invention for fabricating the semiconductor devices of FIGS. 1A and 1C.

In overview and as an example, the device of FIG. 3A may be fabricated according to the following process. First, an oxide-based mask, for example, is formed on the top surface of a SiC substrate 102, which mask has an opening therein along a portion of the termination region 152 and active area 150 to expose the top surface of the substrate. Thereafter, a boron implant, for example, is performed on the top surface of the substrate through the opening. A phosphorus implant, for example, is then performed along the bottom surface of the substrate. Thereafter, the mask on the top surface of the substrate is removed and the boron and phosphorous implants are annealed. As a result, guard ring 112 of $P^+$ conductivity is formed in the top surface of the substrate and the bottom surface becomes highly doped, thereby allowing an ohmic contact to be formed when contact metal 120 is deposited on the bottom surface.

Next, a layer of LTO TEOS, for example, is deposited on the top surface of substrate 102 and is thereafter masked and etched to form field oxide ring 108. Next, a Schottky barrier metal layer 104, such as titanium, and a contact metal layer 106, such as aluminum, are deposited on the top surface of the device and are thereafter sintered, forming a Schottky contact along the active area 150. Thereafter, the Schottky barrier metal layer and the contact metal layer are masked and then etched along the termination region 152 and cutting street 154 and the mask then removed, thereby forming anode electrode 106 and field plate 114.

Next, a passivation layer, such as amorphous silicon, is applied over the top surface of the device. The amorphous silicon layer is then masked and etched along the active area and cutting street and the mask then removed. Thereafter, the amorphous silicon is sintered, resulting in the formation of passivation layer 116 and thereby the device shown in FIG. 3A. Again, if a bondable form of the device is required, the device is completed by forming a cathode electrode on the bottom surface thereof. Alternatively, solderable contact 110 and optionally, passivation layer 118, of the present invention may be formed using, for example, the following additional process steps.

Figure 3B:
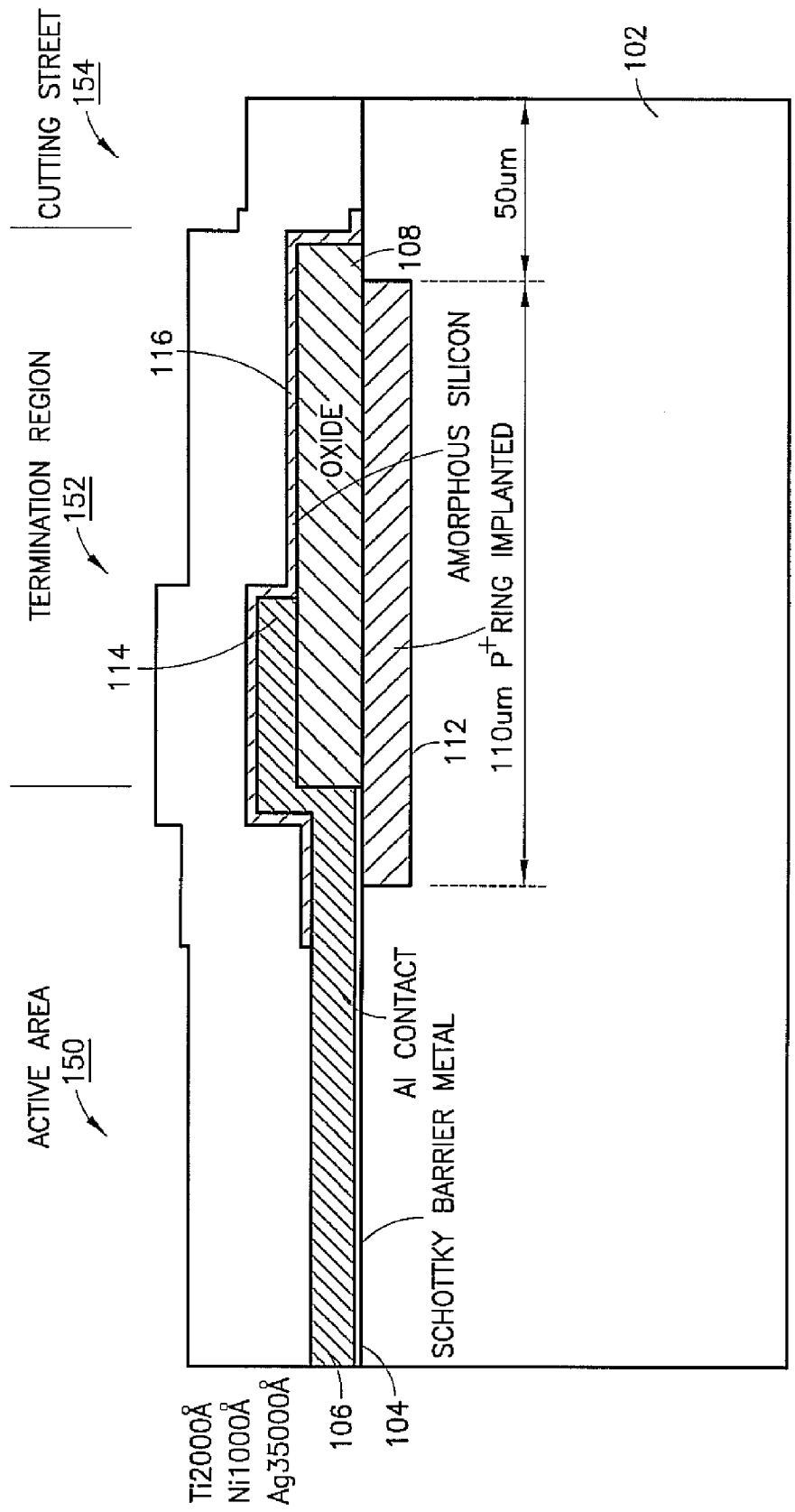

Referring to FIG. 3B, a solderable top metal 136 is applied over the top surface of the device shown in FIG. 3A. Again, this solderable top metal may be a silver-containing trimetal stack, such as a titanium/nickel/silver stack each with a respective thickness, for example, of about 2000 Å, 1000 Å, and 35000 Å. Next, a mask (not shown in the Figures) is formed over the surface of the solderable top metal using photolithography, for example, and the metal then etched, removing the metal from the termination region and cutting street and forming solderable contact 110. During the etching process, gap 125 is also formed, separating the solderable contact and passivation layer 116 by a spaced distance. The remaining mask layer over solderable contact 110 is then removed, resulting in the device shown in FIG. 3C. Again, gap 125 preferably extends to the surface of anode electrode 106 and preferably surrounds the periphery of solderable contact 110.

Figure 3C:
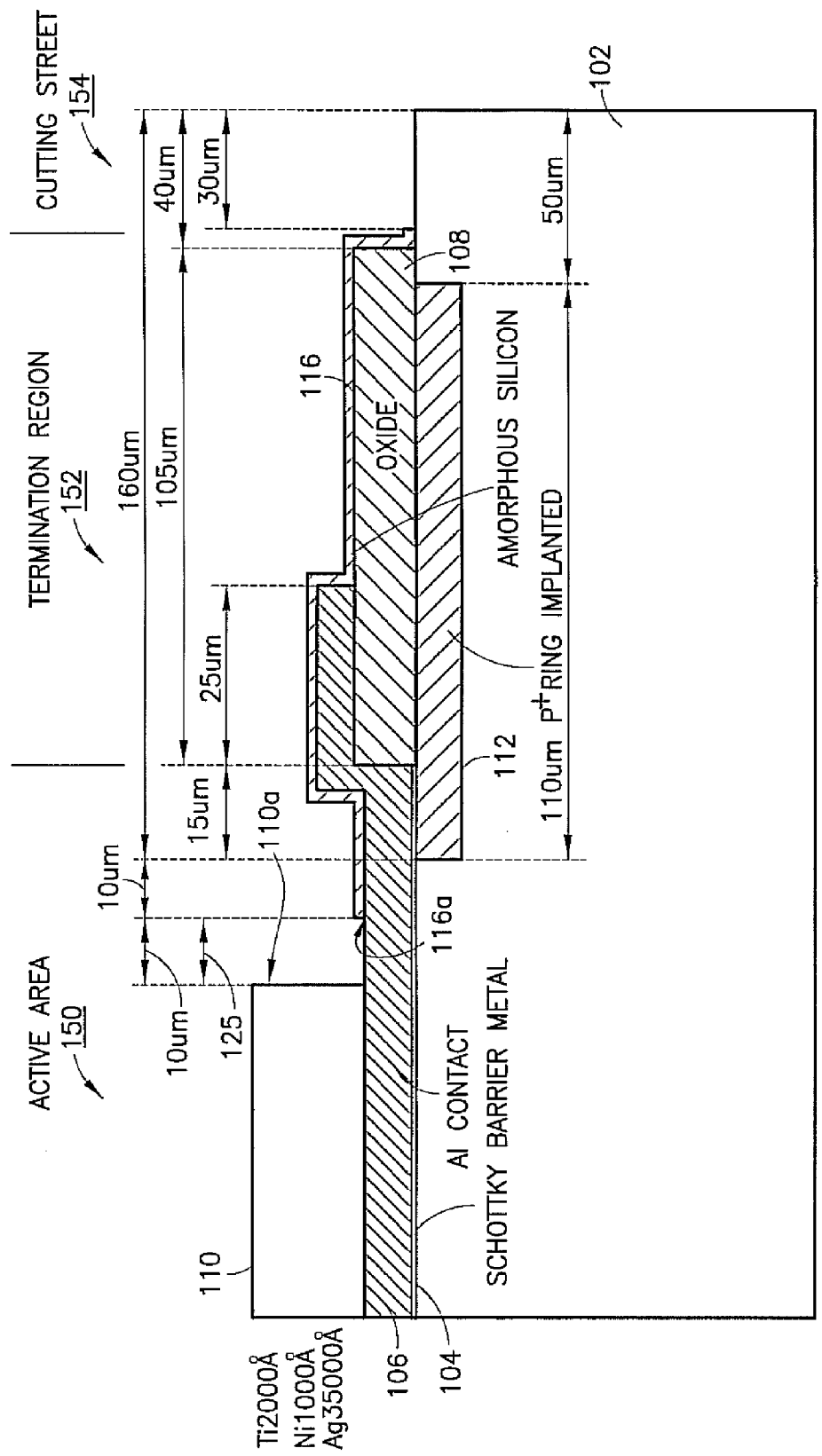

To form device 100a of FIG. 1A, for example, a back side contact metal 120 is finally applied along the bottom surface of the device of FIG. 3C, thereby forming a cathode electrode.

Alternatively, if device reliability/roughness is an issue as described above, a second passivation layer 118 may be formed over the first passivation layer 116, resulting in device 100b of FIG. 1C, for example. Passivation layer 118 may be a photo imagable polyimide layer, a PSG oxide layer, or a silicon nitride layer, for example. Assuming passivation layer 118 is made of photopolyimide, layer 118 is formed by first depositing the photopolyimide over the surface of the device shown in FIG. 3C. A mask is then formed over the surface of the deposited photopolyimide and the photopolyimide layer etched along the active area and cutting street, removing the photopolyimide from the surface of the solderable contact 110, from gap 125, and from cutting street 154, thereby forming passivation layer 118 as shown in FIG. 1C. Passivation layer 118 may extend the full length of passivation layer 116 or may extend beyond the end 116b of passivation layer 116 and into the cutting street, for example. In addition, passivation layer 118 preferably has a thickness such that the top surface of the passivation layer at least has the same height as the top surface of solderable contact 110 in the area of gap 125, as shown in FIG. 1C. However, this thickness is not required and is a function of the passivation material and the blocking voltage of the device, as described above.

To complete device 100b, a back side contact metal 120 is applied along the bottom surface of substrate 102.

As can be seen, the fabrication process for a solderable contact and a second passivation layer of the present invention is compatible with existing SiC process fabrication steps.

One skilled in the art will recognize that a device according to the present invention is not limited to a Schottky diode with a single ring field plate termination, as described above, and is also applicable to Schottky diodes with different forms of field plates, guard rings (e.g., single, multiple, and floating), and JTE terminations, for example. In addition, the present invention is not limited to a 600V device and in particular, is capable of reliably providing a robust termination and passivation for SiC devices from about 300V up to about 1600V. For example, referring to FIGS. 4A-4E, in which like numerals identify like features, there are shown SiC Schottky diodes 400a-400e according to embodiments of the present invention, each diode having an alternative termination (note that the dimensions shown in FIG. 4A-4E are for example purposes and that devices 400a-400e are not drawn to scale). Similar to devices 100a and 100b, devices 400a-400e each has a solderable contact 110 and a gap 125 formed between this contact and adjacent passivation layers 116 and 118. Note that while devices 400a-400e are shown as including passivation layer 118, this passivation layer is not required.

Figure 4A:
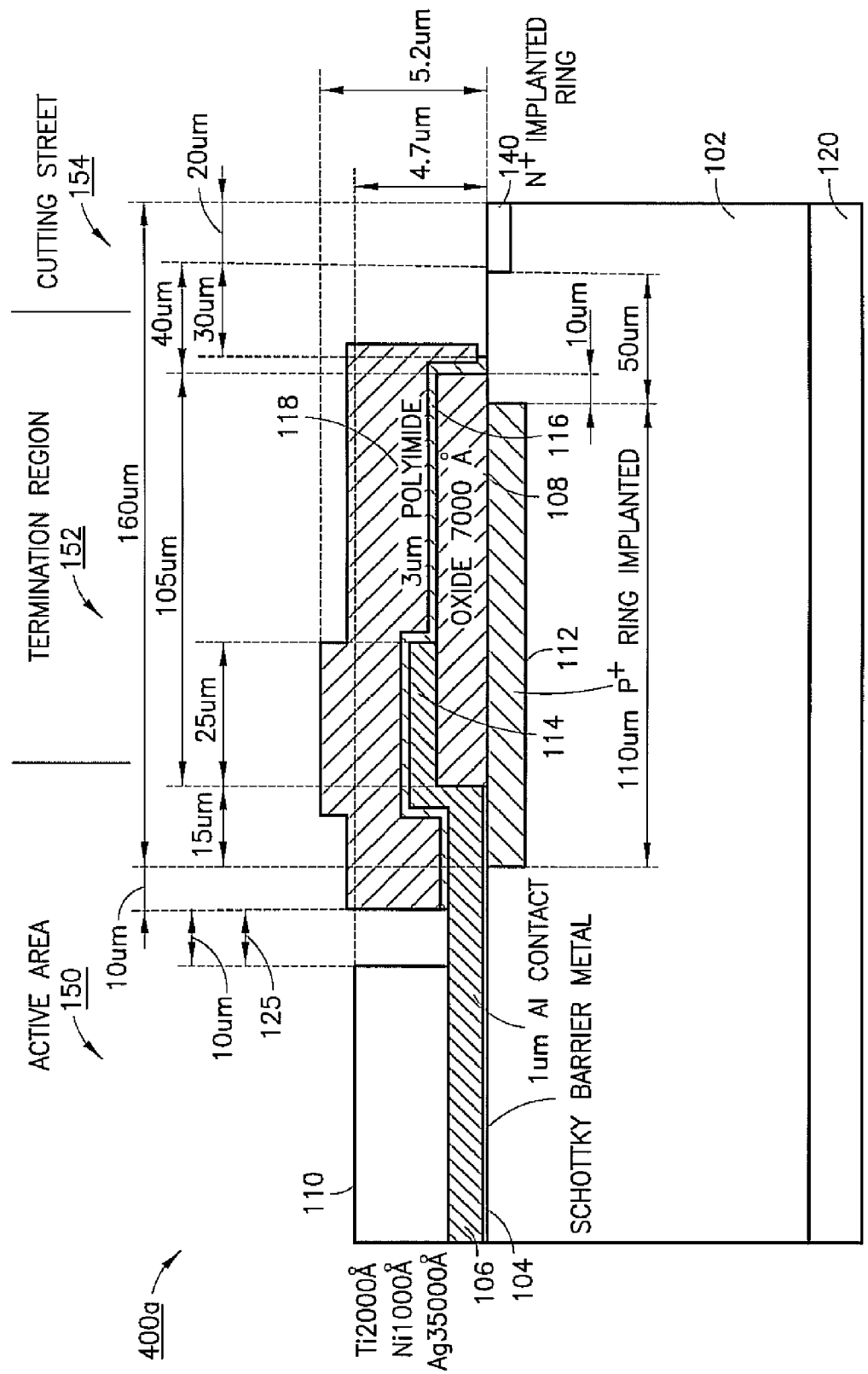
FIGS. 4A, 4B, 4C, 4D, and 4E show cross-sectional views of portions of semiconductor devices according to embodiments of the invention, the devices of FIGS. 4A, 4B, 4C, 4D, and 4E having different terminations.
Figure 4B:
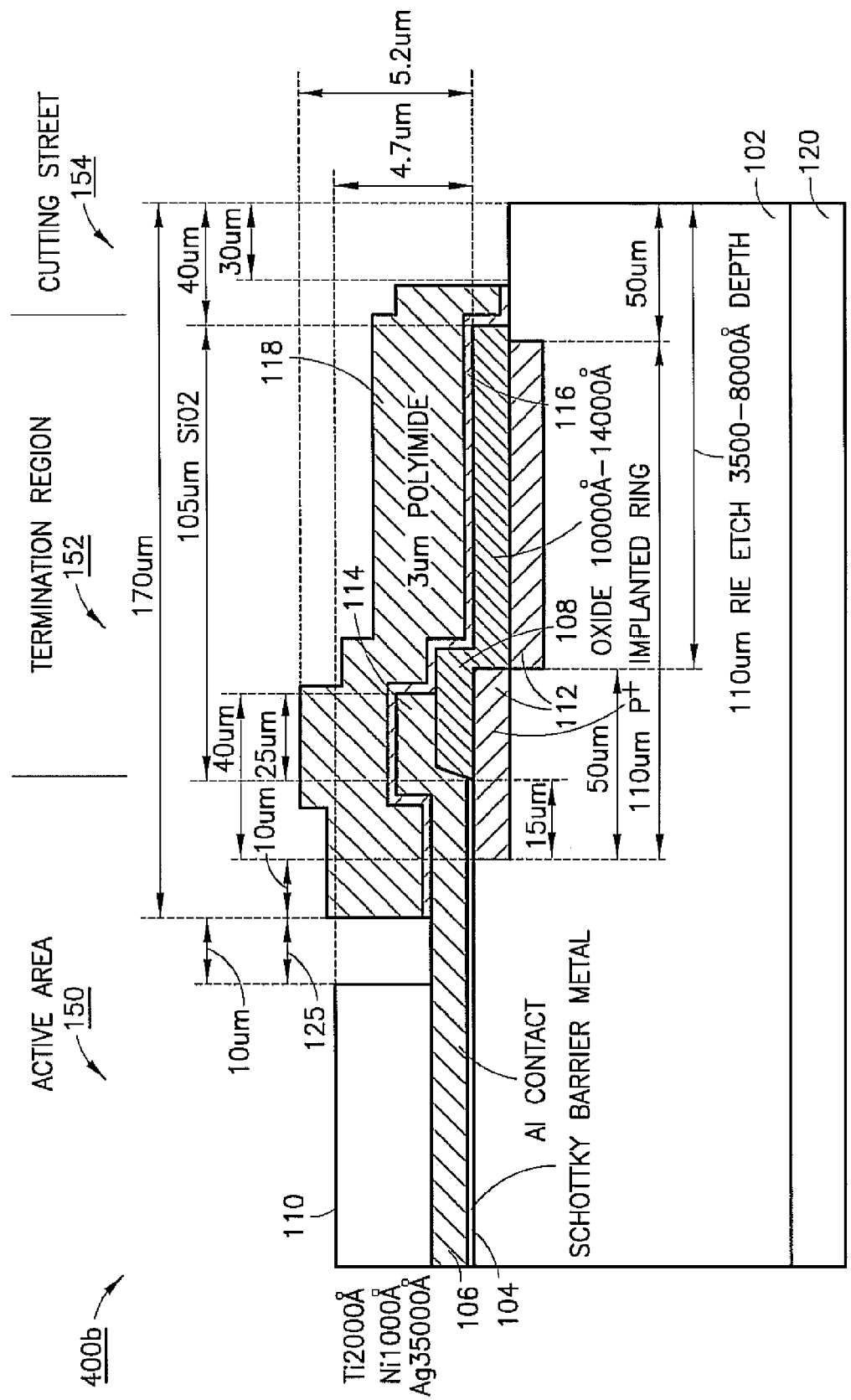
Figure 4C:
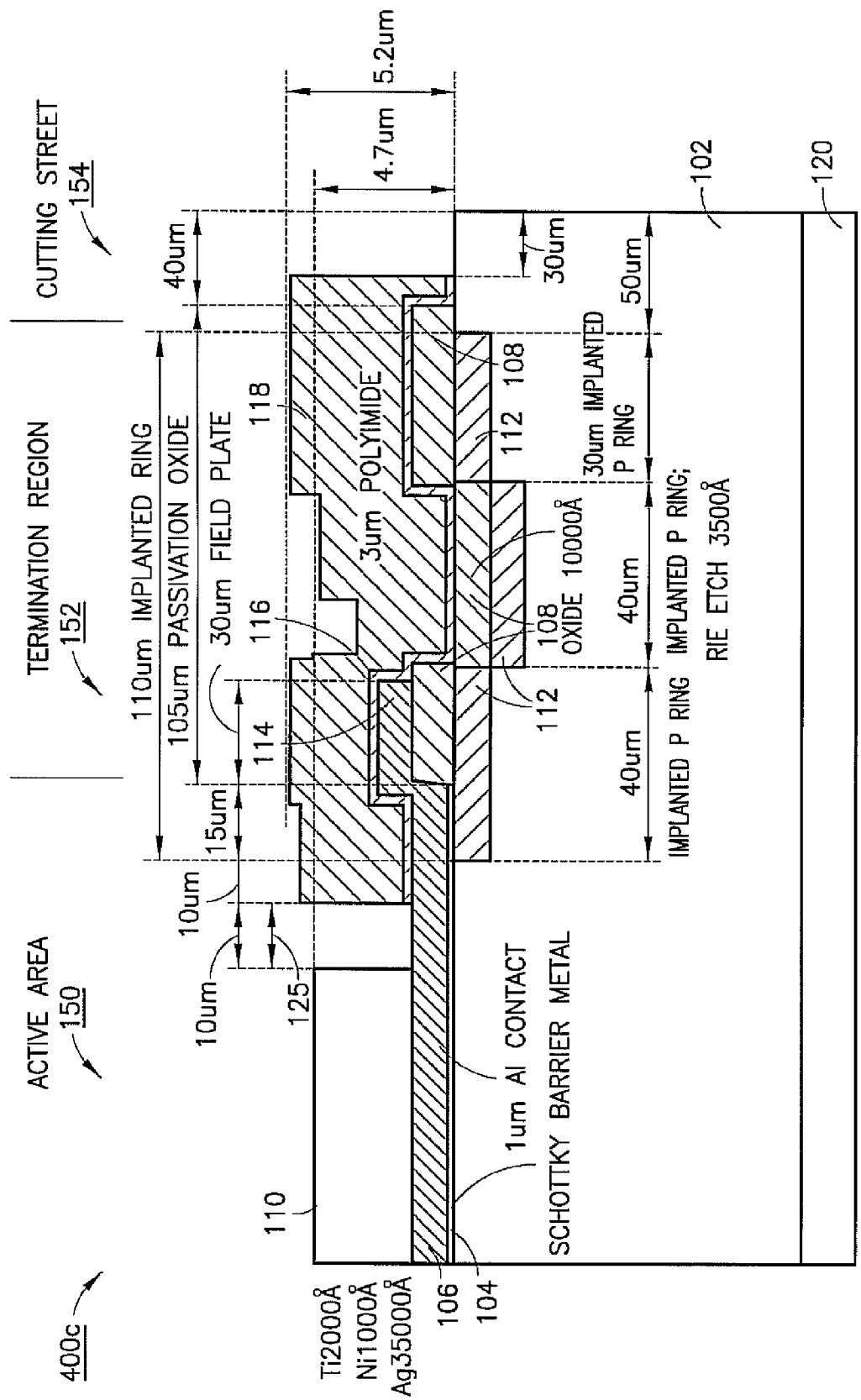
Figure 4D:
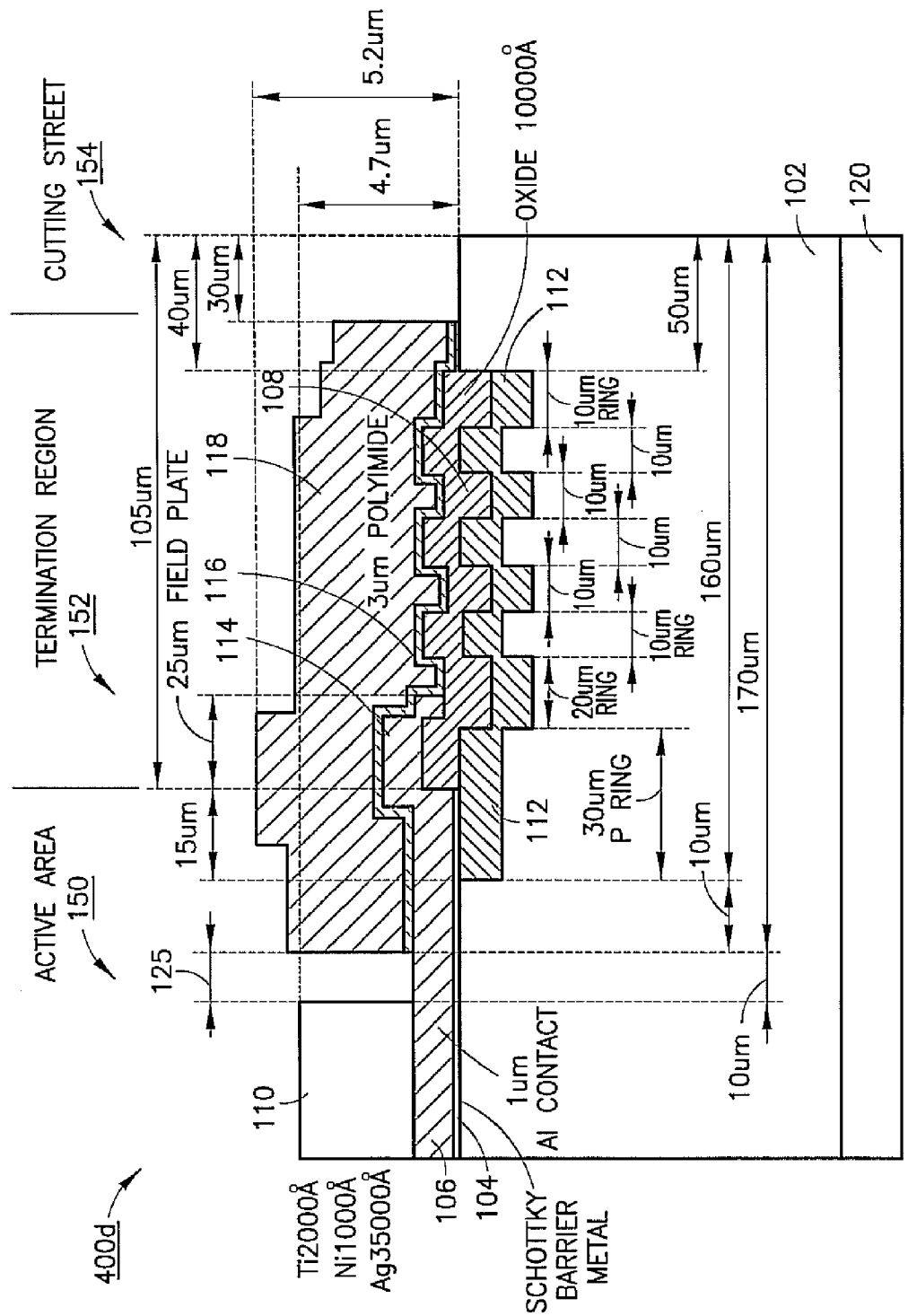
Figure 4E:
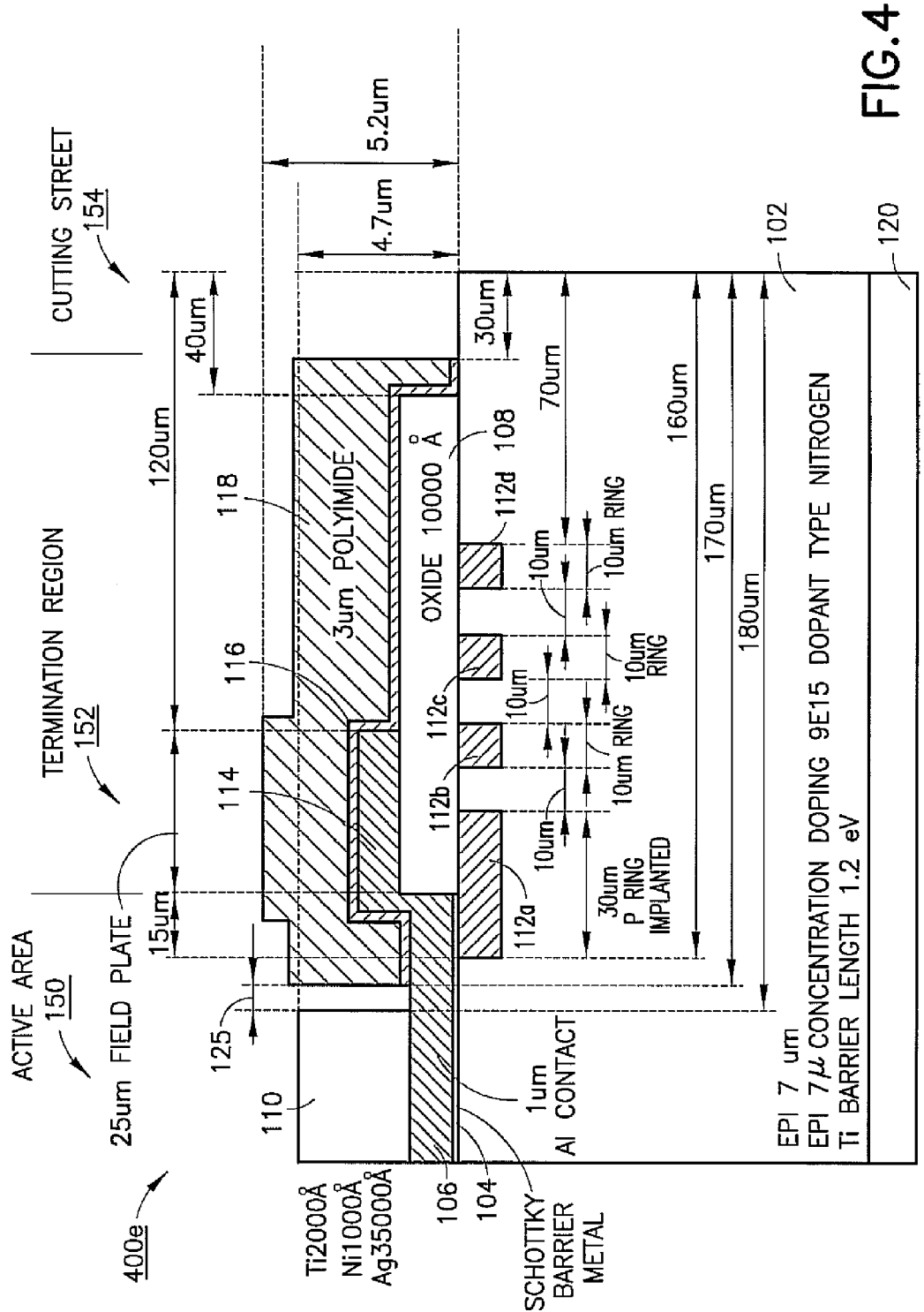

In overview, device 400a of FIG. 4A is similar to device 100b, for example, but now further includes an N+ diffusion 140 that laterally surrounds the die edge along cutting street 154. Devices 400b, 400c, and 400d of FIGS. 4B, 4C, and 4D include multiple stepped field oxide rings 108 and multiple stepped guard rings 112 of P+ conductivity, for example. Device 400e of FIG. 4E has a single field oxide ring 108 and multiple guard rings 112a-d, with rings 112b-d being floating guard rings.

One skilled in the art will also recognize that solderable contact 110, gap 125, and passivation layer 118 of the present invention are not limited to SiC Schottky diodes and are also applicable to other SiC power devices, such as MOSFETs. In addition, the present invention is also applicable to both vertical and lateral conduction devices. As an example, for a MOSFET with two or more electrodes on a top surface thereof, each electrode may include a solderable contact 110 of the present invention, with each solderable contact being spaced from an adjacent passivation layer(s) by a gap 125.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
    a silicon carbide substrate having a top surface;
    at least one power electrode over said top surface of said substrate;
    a passivation layer over said top surface of said substrate and disposed on an outer peripheral edge of said power electrode; and
    a solderable contact disposed on a portion of a top surface of said power electrode, said solderable contact being a spaced distance from said passivation layer such that adjacent sides of said solderable contact and said passivation layer form a gap that extends to the top surface of said power electrode.

2. The semiconductor device of claim 1, wherein top and side surfaces of said solderable contact are entirely exposed for solder connection.

3. The semiconductor device of claim 2, wherein said solderable contact is a silver-containing contact and wherein after soldering, the entire top and side surfaces of said solderable contact are fully converted to a solder alloy.

4. The semiconductor device of claim 1, wherein said gap is from about 5 um wide to about 80 um wide.

5. The semiconductor device of claim 1, wherein said solderable contact includes silver.

6. The semiconductor device of claim 1, wherein said solderable contact is a solderable trimetal, a top portion of said trimetal being composed of silver.

7. The semiconductor device of claim 1, wherein said passivation layer is an amorphous silicon layer.

8. The semiconductor device of claim 1, wherein said passivation layer is a first passivation layer and wherein said device further comprises a second passivation layer disposed over said first passivation layer.

9. The semiconductor device of claim 8, wherein said second passivation layer extends up to said gap such that a side of said second passivation layer is adjacent to the side of said solderable contact, thereby further defining said gap.

10. The semiconductor device of claim 9, wherein the side of said solderable contact extends to a first height above the top surface of said substrate and the side of said second passivation layer extends to a second height above the top surface of said substrate, and wherein said second height is about equal to or greater than said first height.

11. The semiconductor device of claim 8, wherein said second passivation layer is either a photo imagable polyimide layer, a PSG oxide layer or a silicon nitride layer.

12. The semiconductor device of claim 1, wherein said device is a Schottky diode and wherein said at least one power electrode is an anode electrode.

13. The semiconductor device of claim 12, further comprising a termination region that includes at least one guard ring.

14. The semiconductor device of claim 13, wherein said device is capable of supporting from about 300V up to about 1600V of blocking voltage.

15. The semiconductor device of claim 1, further comprising a conductive clip or a leadframe electrically connected to said solderable contact.

16. A semiconductor device comprising:
   a silicon carbide substrate having a top surface;
   at least one power electrode over said top surface of said substrate;
   a first passivation layer over said top surface of said substrate and surrounding an outer peripheral edge of said power electrode;
   a second passivation layer over said first passivation layer and surrounding the outer peripheral edge of said power electrode; and
   a solderable contact disposed on a portion of a top surface of said power electrode, said solderable contact being a spaced distance from said first and second passivation layers such that said solderable contact and said first and second passivation layers form a gap there between.

17. The semiconductor device of claim 16, wherein said gap is from about 5 um wide to about 80 um wide.

18. The semiconductor device of claim 16, wherein said first passivation layer is amorphous silicon layer and said second passivation layer is either a photo imagable polyimide layer, a PSG oxide layer, or a silicon nitride layer.

19. The semiconductor device of claim 16, wherein adjacent sides of said solderable contact and said second passivation layer form a portion of said gap, and wherein side adjacent sides extend to approximately the same height above the top surface of said substrate.

20. The semiconductor device of claim 16, wherein top and side surfaces of said solderable contact are entirely exposed for solder connection, wherein said solderable contact is a silver-containing contact, and wherein after soldering, the entire top and side surfaces of said solderable contact are fully converted to a solder alloy.

\* \* \* \* \*